United States Patent [19]

Biwa et al.

[11] Patent Number: 4,757,362
[45] Date of Patent: * Jul. 12, 1988

[54] HIGH VOLTAGE MOS TRANSISTOR

[75] Inventors: Tetuo Biwa, Osaka; Kiyotoshi Nakagawa, Nara, both of Japan

[73] Assignee: Sharp Kabushiki Kaisha, Osaka, Japan

[*] Notice: The portion of the term of this patent subsequent to Sep. 30, 2003 has been disclaimed.

[21] Appl. No.: 267,642

[22] Filed: May 27, 1981

[30] Foreign Application Priority Data

May 30, 1980 [JP] Japan ............................ 55-73919

[51] Int. Cl.4 .................. H01L 29/78; H01L 29/44
[52] U.S. Cl. ................................ 357/23.8; 357/53; 357/23.4; 357/54
[58] Field of Search ............... 357/23, 24, 53, 54, 357/63, 72, 73

[56] References Cited

U.S. PATENT DOCUMENTS

| T964,009 | 11/1977 | Chiu et al. ........................ 357/23 |
| 3,841,926 | 10/1974 | Garnache et al. ................. 357/53 |
| 3,890,698 | 6/1975 | Clark ................................ 357/53 |
| 3,967,310 | 6/1976 | Horiuchi et al. .................. 357/54 |
| 4,009,483 | 2/1977 | Clark ................................ 357/53 |
| 4,079,504 | 3/1978 | Kosa ................................ 29/571 |
| 4,157,563 | 6/1979 | Bosselaar ......................... 357/53 |
| 4,172,260 | 10/1979 | Okabe et al. ..................... 357/23 |
| 4,199,774 | 4/1980 | Plummer ..................... 357/23 UD |
| 4,270,137 | 5/1981 | Coe ................................... 357/53 |
| 4,290,077 | 9/1981 | Ronen ............................... 357/41 |
| 4,292,729 | 10/1981 | Powell ............................. 29/571 |
| 4,394,674 | 7/1983 | Sakuma et al. .............. 357/23 HV |

FOREIGN PATENT DOCUMENTS

| 963174 | 2/1975 | Canada ............................... 357/53 |
| 2031082 | 4/1971 | Fed. Rep. of Germany ........ 357/53 |
| 54-37584 | 3/1979 | Japan ................................. 357/53 |
| 300472 | 4/1968 | Sweden ............................. 357/53 |

Primary Examiner—Andrew J. James
Assistant Examiner—John Lamont
Attorney, Agent, or Firm—Birch, Stewart, Kolasch & Birch

[57] ABSTRACT

A MOS transistor is featured by the provision of a conductive covering element for covering a drift channel region of the semiconductor device. The covering element is interposed by an insulating layer which is relatively thick. The covering element comprises a floating conductive element, disposed on the insulating layer, and a field plate means, disposed on a second insulating layer.

6 Claims, 2 Drawing Sheets

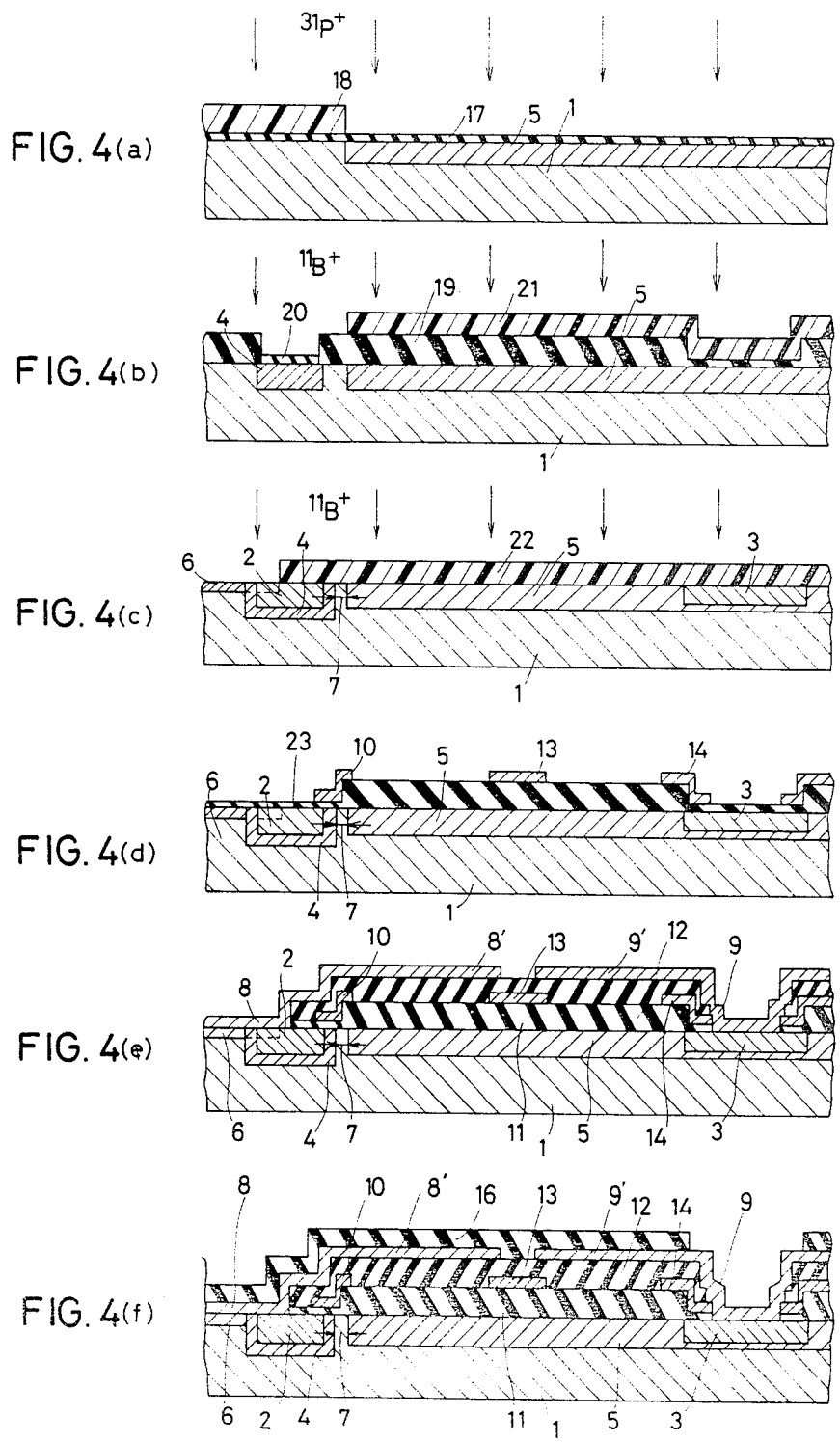

HIGH VOLTAGE MOS TRANSISTOR

BACKGROUND OF THE INVENTION

The present invention relates to a metal oxide semiconductor (MOS) transistor and, more particularly, to a high voltage MOS transistor.

To establish an improved high voltage MOS transistor by preventing field concentration near an edge of a gate electrode, an attempt has been made in which there has been additionally provided a high resistant layer adjacent a drain as a part of the drain region, the conductivity type of the high resistant layer being the same as the drain.

The conventional transistor comprises a P type substrate, an N+ type source region, an N+ type drain region, a P+ region, an N− type high resistant layer, a source electrode, a drain electrode, insulating layers, a gate electrode, field plate layers, and an additional field plate layer made of Al, polycrystalline silicon, or the like.

The P+ type region surrounds the N+ type source region for providing a gate channel for the transistor. The layer is formed by a diffusion-self-alignment process. A high voltage diffusion-self-alignment MOS transistor is described in Awane et al U.S. Pat. No. 4,058,822 issued Nov. 15, 1977, assigned to the present assignee, entitled "HIGH VOLTAGE, LOW ON-RESISTANCE DIFFUSION-SELF-ALIGNMENT METAL OXIDE SEMICONDUCTOR DEVICE AND MANUFACTURE THEREOF". The disclosure of this patent is incorporated herein by reference.

Around the N+ type drain region, the N− type high resistant layer is provided for preventing field concentration at the edge of the gate electrode. The layer constitutes a part of the drain region. Each of the source electrode and the drain electrode is composed of Al, polycrystalline silicon, or the like. Each of the field plate layers extends from each of the source electrode and the drain electrode. The gate electrode is made of Al or polycrystalline silicon, called a silicon gate.

The field plate layer which extends from the source electrode functions to reduce field concentration at the edges of the gate electrode. The field plate layer which extends from the drain electrode functions to reduce field concentration at the boundary between the N+ type layer and the N− type layer.

If one of the field plate layers extends over a suitable limitation, a reverse field plate effect may be generated which is applied to the drain portion by the layer which extends from the source electrode or to the edge of the gate electrode by the layer which extends from the drain electrode. This reduces the value of a sustained voltage.

To eliminate the generation of the reverse field plate effect, the above-mentioned structure of the transistor includes a region of the N− type high resistant layer, not covered with the field plate layers, made of Al or the polycrystalline silicon. However, the amount of a sustainable voltage in the ON condition, the amount of the drain current and the value of $R_{ON}$, will inevitably undesirably vary, according to this structure.

SUMMARY OF THE INVENTION

In view of the foregoing, it is an object of the present invention to provide an improved high voltage MOS transistor for eliminating the above-stated disadvantages.

It is another object of the present invention to provide an improved high voltage MOS transistor comprising a high resistance portion adjacent a drain region, the high resistance portion being substantially and completely covered by a conductive layer to thereby prevent effect by externally applied charges, referred to as a field plate effect. Briefly described, the MOS transistor of the present invention is featured by the provision of a conductive covering element for covering a drift channel region of the semiconductor device. The covering element is interposed by an insulating layer of a defined thickness. The covering element comprises a floating conductive element, disposed on a first insulating layer, and a field plate means, disposed on a second insulating layer.

BRIEF DESCRIPTION OF THE DRAWINGS

The present invention will become more fully understood from the detailed description given hereinbelow and the accompanying drawings which are given by way of illustration only, and thus are not limitative of the present invention and wherein:

FIGS. 4(a) through 4(f) show manufacturing steps for preparing the transistor of FIG. 1.

DESCRIPTION OF THE INVENTION

Figure 1:
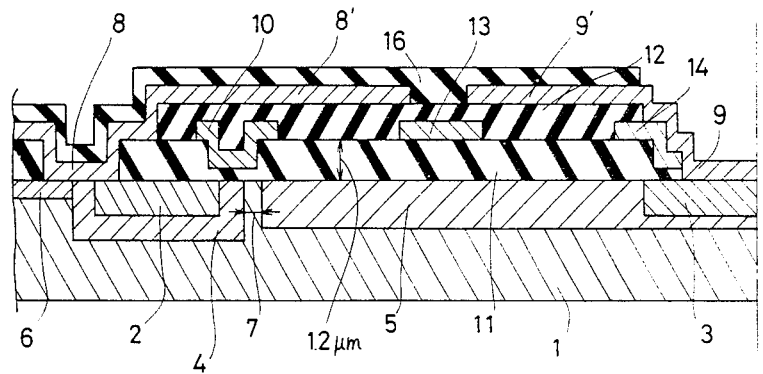
FIG. 1 shows a sectional view of a specific example of a high voltage MOS transistor according to the present invention.

FIG. 1 shows an example of a high voltage MOS transistor according to the present invention. The transistor comprises a P type semiconductor substrate 1, an N+ type source region 2, an N+ type drain region 3, a P+ type region 4, an N− type pinch high resistance layer 5, a field dope region 6, a source electrode 8, a drain electrode 9, a gate electrode 10, insulating layers 11 and 12, field plates 8', 9' and 14, a protective insulating layer 16, and a floating conductive element 13.

The P+ type region 4 is formed around the N+ type source region 2 by diffusion self allignment techniques. The region 4 is for the purpose of providing a gate channel of this MOS transistor. The N− type pinch high resistance layer 5 is connected to the N+ type drain region 3. The source electrode 8 is connected to the N+ type source region 2. The drain electrode 9 is coupled to the N+ type drain region 3.

Each of the field plates 8' and 9' extends from the source electrode 8 and the drain electrode 9, respectively. The insulating layer 12 is provided for covering the floating conductive element 13 which is separated, by the layer 12, from each of the field plates 8' and 9'. The element 13 is preferably made of Al, polycrystalline silicon, Mo, W or the like.

As a feature of the present invention, the thickness of the part of the insulating layer 11 covering the P+ type channel region is preferably limited to be in the order of about 0.1 to about 5 μm while the thickness of the remaining part of the insulating layer 11 covering the N− type pinch high resistance layer 5 is preferably limited to be in the order of about 1.0 to about several microns, more preferably, about 1.2 μm so as to prevent dielectric breakdown.

However, as represented by the illustrations, the thickness of the isulating layer 11 above the P+ type channel region 4 beneath the gate electrode is always less than the thickness of the same insulating layer 11 above the N− type region 5.

Manufacturing steps for the transistor of FIG. 1 are described in FIGS. 4(a) to 4(f).

FIG. 4(a): The P type semiconductor substrate 1 has a small density of impurity. A resist 18 is provided for covering parts in which the source region and the channel region are to be formed. Implantation of $^{31}$P+ ion is conducted through an oxide film 17 covering the total surface of the substrate 1. This implanted impurity is thermally treated to provide diffusion for the purpose of making the N− type pinch high resistance layer 5.

FIG. 4(b): A thick oxide film 19 is prepared by thermal treatment in an oxidizing atmosphere in the step of FIG. 4(a). The oxide film 19 is windowed at the source and the drain regions formed by photo etching. A thin oxide film 20 is formed at these regions, thereafter. While a resist 21 is covering partial points of this surface, ion implantation and diffusion treatment from the surface are to prepare the P+ type channel region 4. The region 4 is separeted from the pinch high resistance layer 5 by a separation 7.

FIG. 4(c): Two N+ type regions are prepared by diffusion or ion implantation to provide the source region 2 and the drain region 3. Thereafter, the oxide films 19 and 20 are removed.

A resist layer 22 is partially positioned on the surface. Ion injection is applied to provide the P+ type field dope region 6.

FIG. 4(d): A thick oxide film 11 is prepared with a thickness of preferably about 1.2 μm on the surface by using chemical vapor deposition. Parts of this film 11 for the drain, the gate and the source regions are removed. A thin oxide film 23 is formed on these parts for preparing a gate oxide layer. A layer of preferably polycrystalline silicon is formed on the total surface and is subjected to N+ doping and diffusion. By etching the layer to remove unrequired portions, the floating conductive element 13, the gate electrode 10, and the field plate 14 are all formed. The field plate 14 extends from the drain electrode 9.

FIG. 4(e): Over the entire surface of the substrate 1, the glass film 12 made of phosphorous silicate glass is deposited by chemical vapor deposition having a window for the drain electrode 9 and the source electrode 8.

A layer, preferably, made of Al is evaporated on the total surface. By removing unrequired parts of this layer, the source electrode 8, the drain electrode 9 and their field plates 8' and 9' are all formed. It is important to prepare the field plates 8' and 9' so that they completely cover parts of the pinch high resistance layer 5 which are uncovered by the floating conductive element 13.

FIG. 4(f): The protecting insulating layer 16 is prepared for covering the semiconductor device, whereby the transistor is completed.

According to the example of FIG. 1, the N− type pinch high resistance layer 5 is completely covered with a combination of the floating conductive element 13 and the field plates 8' and 9'. The floating conductive element 13 is not connected to either of the source electrode 8, the drain electrode 9, or the gate electrode 10 and is formed on a relatively thick portion of the insulating layer 11. Each of the field plates 8' and 9' extends from each of the source electrode 8 and the drain electrode 9, respectively.

This arrangement enables the value of a sustainable voltage in the ON condition to depend greatly on the distance between the surfaces of the layer 5 and the floating conductive element 13 as defined by the thickness of the insulating layer 11. The sustained-voltage characteristics are highly improved.

In fact, when a MOS FET is driven with a condition of $V_{gs} - V_{th} = 4$ V, a sustainbale voltage in the ON condition becomes about 220 V or more with high reliability.

Figure 2:
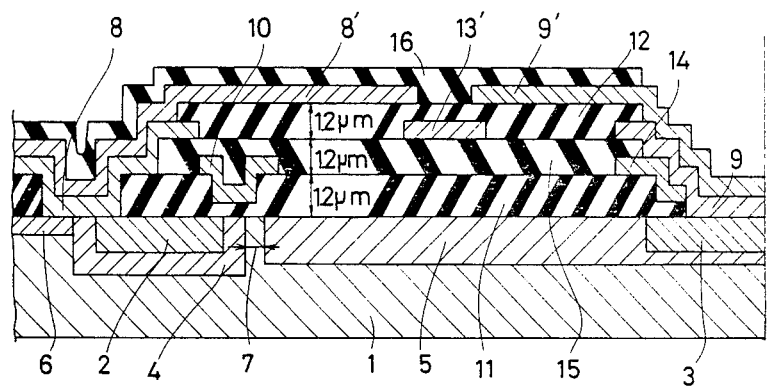
FIGS. 2 and 3 show each a sectional view of another specific example of the high voltage MOS transistor according to the present invention.

FIG. 2 shows another example of the MOS FET according to the present invention. This example is characterized by preparing the insulating layer 11 with a thickness preferably about 1.0 to about several microns, more preferably, about 1.2 μm by chemical vapor deposition and further by preparing, in addition to the glass film 12, a layer 15, with a similar thickness, made of phosphorous silicate glass by chemical vapor deposition. Another type of flaoting conductive element 13' is disposed on the film 15. The element 13' may be made of Al, polycrystalline silicon, Mo, W, or the like.

The structure of FIG. 2 provides the sustainable voltage in the ON condition of about 350 V with high reliability when controlled with a condition of $V_{gs} - V_{th}4$ V.

A process known as "LOCOS" (Local Oxidation of Silicon) can be applied to prepare the layer 11 in FIG. 2. Further, deposition of the layers 15 and 12 can be repeated twice, three times, or more. Any similar type of insulating layer can be prepared.

Figure 3:
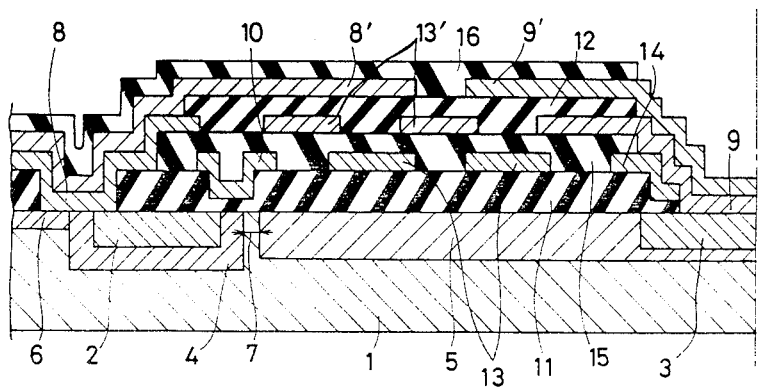

FIG. 3 shows a further example of the MOS FET according to the present invention. This example is characterized by disposing two or more blocks of the floating conductive elements 13 and 13', respectively, on the layers 11 and 15.

This type also provides a high sustainable voltage value in the ON condition with high reliability.

Throughout the examples of FIGS. 1 to 3, the N− pinch high resistance end of the layer 5 not connected to the drain region 3 is separated from the P+ type channel region 4 to provide the separation 7 of P− type. The field dope region 6 is produced by doping with an impurity to make a P+ type layer. The region 6 is positioned outside the region 4. The source electrode 8 connected to the region 2 is also connected to the P+ channel region 4 and the field dope region 6.

Improvement of cut-off sustain voltage and an operating sustain voltage by a high voltage bias, called "ON sustain voltage", is achieved by the provision of the separated portion 7, and the connection between the P+ channel region 4, the source region and the field dope region 6. It is preferable to provide the separated portion 7 of about 10 μm.

The invention being thus described, it will be obvious that the same may be varied in many ways. Such variations are not to be regarded as a departure from the spirit and scope of the invention, and all such modifications are intended to be included within the scope of the following claims.

What is claimed is:

1. An high voltage metal oxide semiconductor device comprising:
   a semiconductor substrate having a conductivity of a first type;

a source region having a conductivity of a second type opposite to that of said semiconductor substrate;

a channel region of the same conductivity type as said semiconductor substrate formed adjacent to and substantially surrounding said source region;

a field dope region positioned lateral to said channel region having a conductivity the same as said first type;

a high resistance region of said second type conductivity medial to and spaced from said channel region;

a first insulating layer overlying said channel region and said high resistance region;

a drain region having a conductivity of said second type opposite that of said semiconductor substrate lateral to said high resistance region opposite said source region;

a drain electrode connected to said drain region;

a source electrode connected to said source region, said channel region and said field dope region;

a gate-electrode formed above said channel region having a first portion of said first insulating layer interpositioned therebetween; and conductive covering means for covering said high resistance region so as to enhance the sustained-voltage characteristics of said MOS device, said covering means comprising at least one floating conductive element and a field plate means, said at least one floating conductive element not being connected to either of said drain electrode, source electrode, and gate electrode, whereas said field plate means is connected to at least one of said drain electrode, source electrode, and gate electrode;

said first insulating layer having a second portion interpositioned between said covering means and said high resistance region with a thickness of about 1.0 micron or greater but at least thicker than said first portion of said first insulating layer overlying said channel portion beneath said gate-electrode.

2. The device of claim 1, wherein said floating conductive element is disposed on said first insulating layer and said field plate means is disposed on a second insulating layer.

3. The device of claim 2, wherein said second insulating layer is made of phosphorous silicate glass.

4. The device of claim 1, wherein there are provided two or more floating conductive elements.

5. The device of claim 1, wherein said at least one floating conductive element is selected from at least one member of the group consisting of Al, Mo, W, or polycrystalline silicon.

6. The device of claim 1, wherein said field plate means comprises a first field plate element connected to said second electrode and a source field plate element connected to said drain electrode.

* * * * *